(12) United States Patent
Chea, Jr. et al.

(10) Patent No.: US 6,903,939 B1
(45) Date of Patent: Jun. 7, 2005

(54) PHYSICAL ARCHITECTURE FOR DESIGN OF HIGH DENSITY METALLIC CROSS CONNECT SYSTEMS

(75) Inventors: Ramon C. W. Chea, Jr., San Jose, CA (US); P. Kingston Duffie, Palo Alto, CA (US); Timothy John Hodgkinson, Santa Clara, CA (US)

(73) Assignee: Turnstone Systems, Inc., Santa Clara, CA (US)

( * ) Notice: Subject to any disclaimer, the term of this patent is extended or adjusted under 35 U.S.C. 154(b) by 363 days.

(21) Appl. No.: 10/126,281

(22) Filed: Apr. 19, 2002

(51) Int. Cl.[7] .............................................. H05K 7/06
(52) U.S. Cl. ......................... 361/788; 361/803; 439/61
(58) Field of Search ................................ 361/785, 788, 361/790, 803; 439/61, 65

(56) References Cited

U.S. PATENT DOCUMENTS

| | | | | |
|---|---|---|---|---|
| 4,647,123 A | * | 3/1987 | Chin et al. ..................... | 439/61 |
| 5,296,748 A | * | 3/1994 | Wicklund et al. ........... | 327/565 |
| 5,448,699 A | * | 9/1995 | Goss et al. ................... | 710/301 |
| 5,887,158 A | * | 3/1999 | Sample et al. ................ | 716/15 |
| 6,163,464 A | * | 12/2000 | Ishibashi et al. ............ | 361/788 |
| 6,528,737 B1 | * | 3/2003 | Kwong et al. ............... | 174/262 |
| 6,538,899 B1 | * | 3/2003 | Krishnamurthi et al. ..... | 361/788 |
| 6,608,762 B2 | * | 8/2003 | Patriche ....................... | 361/788 |
| 6,711,028 B2 | * | 3/2004 | Iny ............................ | 361/788 |
| 2002/0181215 A1 | * | 12/2002 | Guenthner ................... | 361/784 |
| 2003/0100198 A1 | * | 5/2003 | Hicks et al. .................. | 439/65 |

* cited by examiner

Primary Examiner—John B. Vigushin
(74) Attorney, Agent, or Firm—Pillsbury Winthrop LLP (57) ABSTRACT

The present invention discloses a physical shelf architecture for high density metallic cross connect systems. The present invention is intended to overcome the problems associated with the physical interconnections of metallic paths in cross connect switching systems. The physical architecture of the present invention effectively performs physical interconnections required by high density metallic cross connect systems. The physical architecture enables for a scalable design and structure of racks and shelves. In particular, interconnect levels can be performed with devices-to-devices, boards-to-boards, shelves-to-shelves, and racks-to-racks.

7 Claims, 12 Drawing Sheets

Shelf Physical Architecture

FIG. 1

Single Stage Cross-Connect Switching System

FIG. 2

Basic Cross-Connect Element

FIG. 3

Multi Stage Cross-Connect Switching System

PHYSICAL ARCHITECTURE FOR DESIGN OF HIGH DENSITY METALLIC CROSS CONNECT SYSTEMS

FIELD OF THE INVENTION

The present invention relates to cross connect systems. More particularly, this invention is directed to a physical architecture in the design of high density metallic cross connect switching systems. Specifically, the present invention is intended to overcome the problems associated with the physical interconnections of metallic paths in cross connect switching systems.

BACKGROUND OF THE INVENTION

Metallic cross connect switching systems have been in existence since the advent of telephony. Legacy switching systems require an operator to manually connect calls between an ingress port and an egress port. In general terms, an "ingress port" refers to an input, and an "egress port" refers to an output. Since human interaction is often inefficient and subject to errors, next generation switching systems were designed for use without operators. Thereafter, with advancements in the field of metallic switching, cross bar switching systems were implemented.

There are many problems and disadvantages with conventional switching systems. For example, the equipment used with such systems are quite large and would typically occupy a large space. In addition, the conventional metallic cross connect switching was labor intensive and often error prone. Moreover, most conventional switching systems are designed such that no more than, for example, 25% of the maximum calls can be serviced. In other words, when the conventional switching system is servicing 25% of the maximum number of calls, additional calls will be "blocked" until the service level is below 25%.

Figure 1:
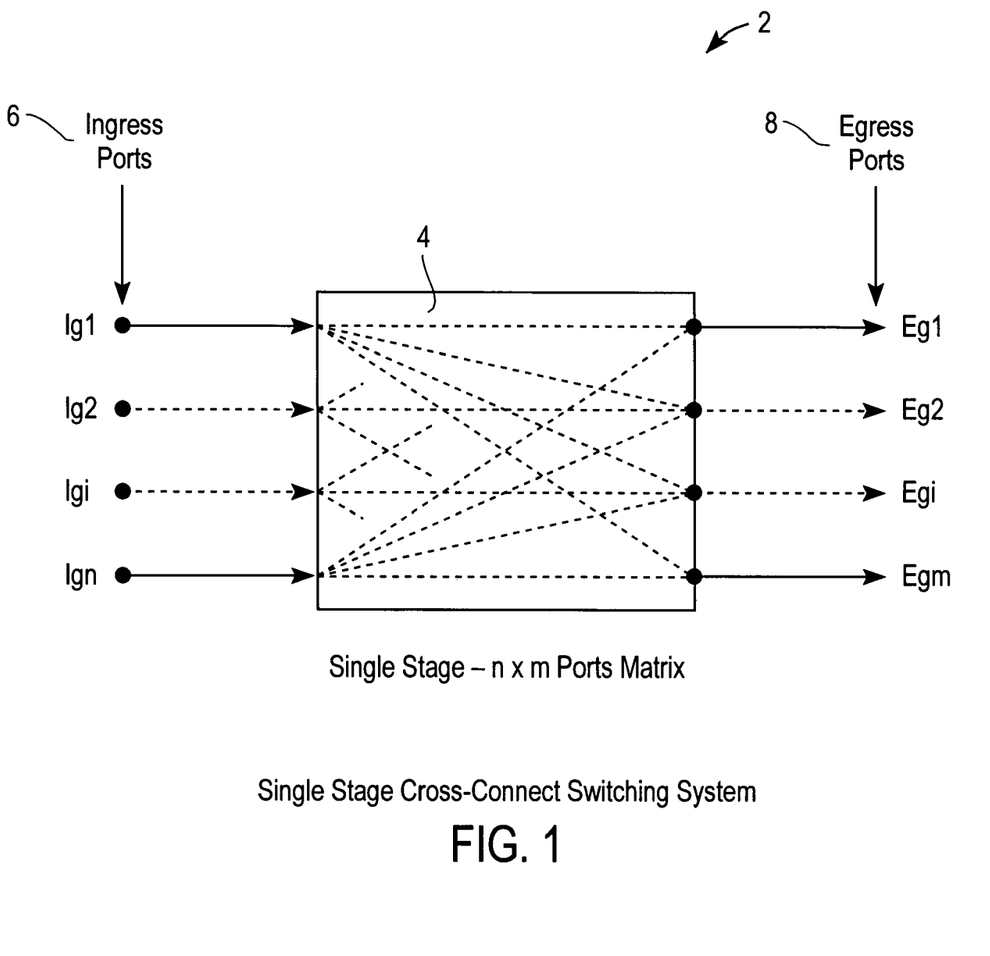
FIG. 1 illustrates a simplified block diagram of a conventional single stage cross connect switching system.

FIG. 1 is a simplified block diagram of a conventional single stage cross connect switching system. This figure illustrates the most basic architecture. The switching system 2 consists of a single stage switching matrix 4 connecting the ingress ports 6 with the egress ports 8. The ingress ports are designated as Ig1, Ig2, Igi, . . . Ign, and the egress ports are designated as Eg1, Eg2, Egi, . . . Egm. Each ingress and egress port consists of a pair of physical wire (i.e., 2 leads). The ingress ports 6 can also be connected to a Main Distribution Frame ("MDF") (not shown) in a Central Office ("CO"). The egress ports 8, likewise, can be connected to another equipment, which may be another MDF.

In the single stage cross connect switching system, n and m each represents the number of ingress and egress ports, respectively. The n and m values can range from, for example, 10 to 100,000. The capacity of a cross connect system is generally referred to as n×m ports. In fact, depending on the value of n and m ports, the cross connect systems are known as follows:

when n is greater than m, it is called a "Concentration System";

when n equals m, it is called a "Squared Matrix System"; and when n is less than m, it is called an "Expansion System."

Another notable characteristic of a cross connect switching system is its ability to make connections from ingress to egress ports. When any ingress port can connect to only some egress ports, this is known as a "Blocking System." When any ingress port can connect to any egress port, this is known as a "Non-blocking System" or "Any-to-Any System."

Figure 2:
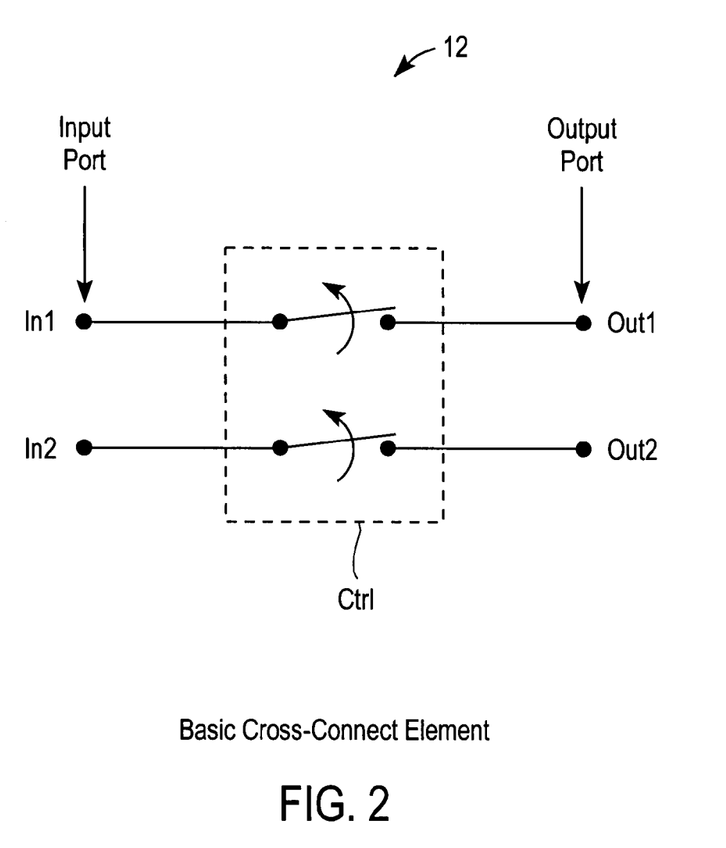
FIG. 2 illustrates a conventional cross connect element.

FIG. 2 illustrates a conventional cross connect element. This basic building block is a basic element in a metallic cross connect system. The element 12 includes two input leads In1, In2, two output leads Out1, Out2, and a control lead Ctrl. A fundamental design characteristic is the interconnection of these leads with each other. The interconnections can take place at different levels including: (1) device level—interconnecting basic elements to form a packaged device; (2) board level—interconnecting devices to form a circuit board; (3) shelf level—interconnecting boards to form a sub-system or system; (4) rack level—interconnecting shelves to form a sub-system or system; and (5) inter-rack level—interconnecting racks to form a sub-system or system. The requirement for the number of basic building elements and the associated packaging level for device, board, shelf, rack, and inter-rack are dictated by the number of ports required for the overall system. To illustrate the number of basic cross connect elements 12 required to implement a single switching stage system is as follows: (1) for a 100×100 ports system, 10,000 cross connect elements are required; (2) for a 1000×1000 ports system, 1,000,000 cross connect elements are required; and (3) for 10,000×10,000 ports system, 100 million cross connect elements are required. As can be appreciated, the number of basic elements required is approximately equal to the product of the number of ingress ports and the number of egress ports.

Figure 3:
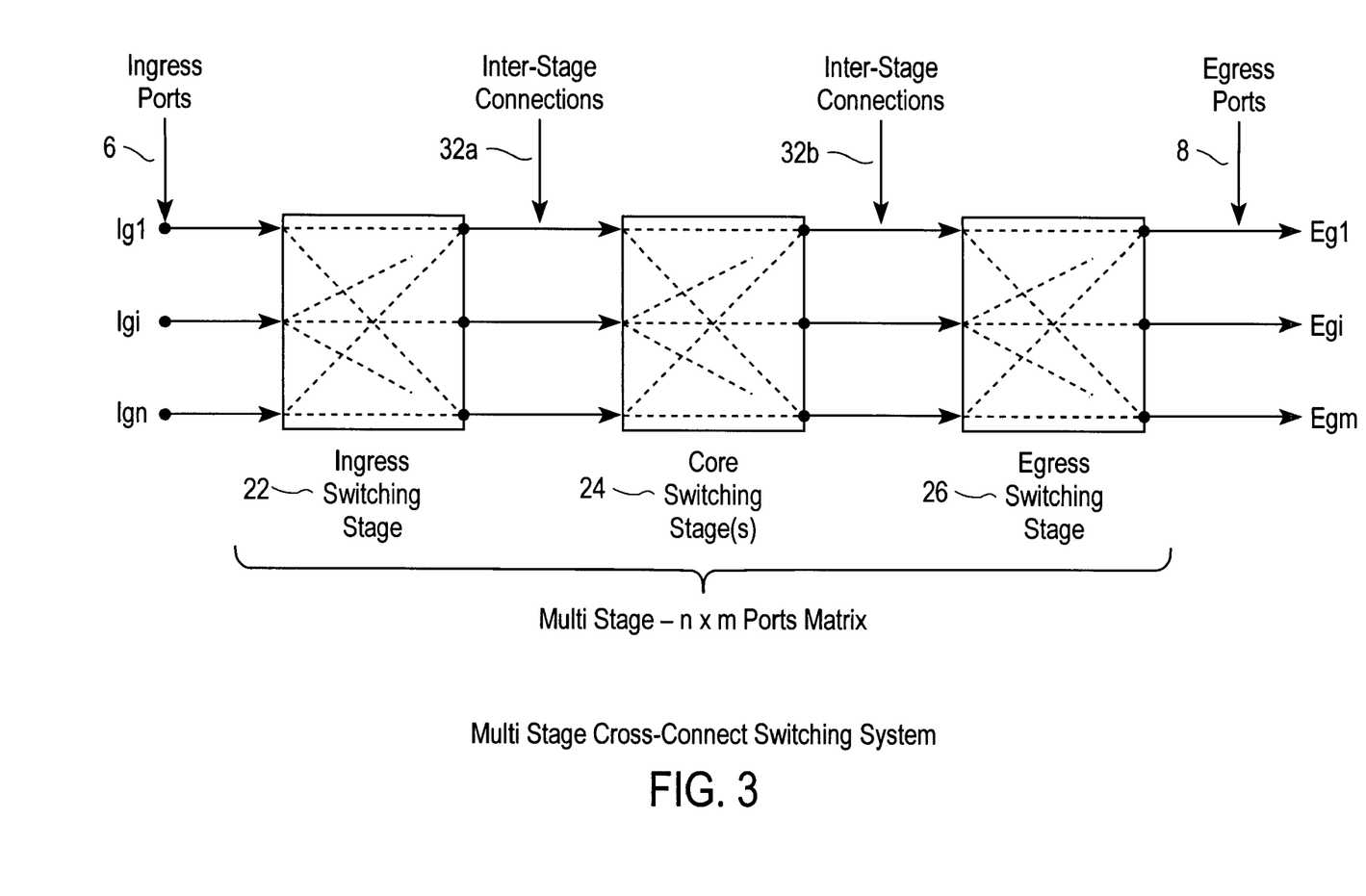
FIG. 3 illustrates a simplified block diagram of a conventional multi-stage cross connect switching system.

FIG. 3 illustrates a simplified block diagram of a conventional multi-stage cross connect switching system. The multi-stage cross connect switching system can be used to reduce the number of basic elements for a given n×m ports systems. FIG. 3 illustrates an architecture using multi-switching stages to reduce the number of basic switching elements. It consists of an Ingress-Switching Stage 22, Core-Switching Stage(s) 24, an Egress-Switching Stage 26, the Inter-Stage Connections 32a, 32b, and the ingress 6 and egress ports 8 for connection to equipments outside the system. Also illustrated are the connections within each switching stage. This multi-switching stage system is used to reduce the number of cross points, but the disadvantage is that there may be a loss of system performance. It can be appreciated that conventional interconnect systems can be quite complex, prone to error during installations and maintenance repair, leading to potential reliability and system performance problems.

As detailed above, the conventional interconnect methods and techniques are inadequate and unworkable because of their physical interconnection tasks are enormous and extremely complex. One of the key challenges today is to design and develop the physical interconnections for the overall system in an efficient and simplified manner. Accordingly, there is a need for a physical architecture to efficiently implement the interconnection requirements demanded by the design of high density metallic cross connect switching systems.

SUMMARY OF THE INVENTION

In view of the above-described problems of the prior art, it is an object of the present invention to provide a scalable physical architecture for high density metallic cross connect systems. The present invention is intended to overcome the problems associated with the physical interconnections of metallic paths in cross connect switching systems. The physical architecture of the present invention effectively performs physical interconnections required by high density metallic cross connect systems. The physical architecture enables for a scalable design and structure of racks and shelves. In particular, inter-connect levels can be performed with devices-to-devices, boards-to-boards, shelves-to-shelves, and racks-to-racks.

BRIEF DESCRIPTION OF THE DRAWINGS

These and other objects and advantages of the present invention will become apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

The present invention will now be described in greater detail, which will serve to further the understanding of the preferred embodiments of the present invention. As described elsewhere herein, various refinements and substitutions of the various embodiments are possible based on the principles and teachings herein.

The preferred embodiments of the present invention will be described with reference to FIGS. 4–12, wherein like components are designated by like reference numerals throughout the various figures. Further, specific parameters such as system architecture, electronic components, cards, connectors, paths and the like are provided herein, and are intended to be explanatory rather than limiting.

The present invention is directed to a physical architecture for effectively performing physical interconnections required by high density metallic cross connect systems. The present invention is further directed to a scalable design and structure of shelves and racks. In particular, the present invention addresses inter-connect levels associated with devices-to-devices, boards-to-boards, shelves-to-shelves, and racks-to-racks.

Figure 4:
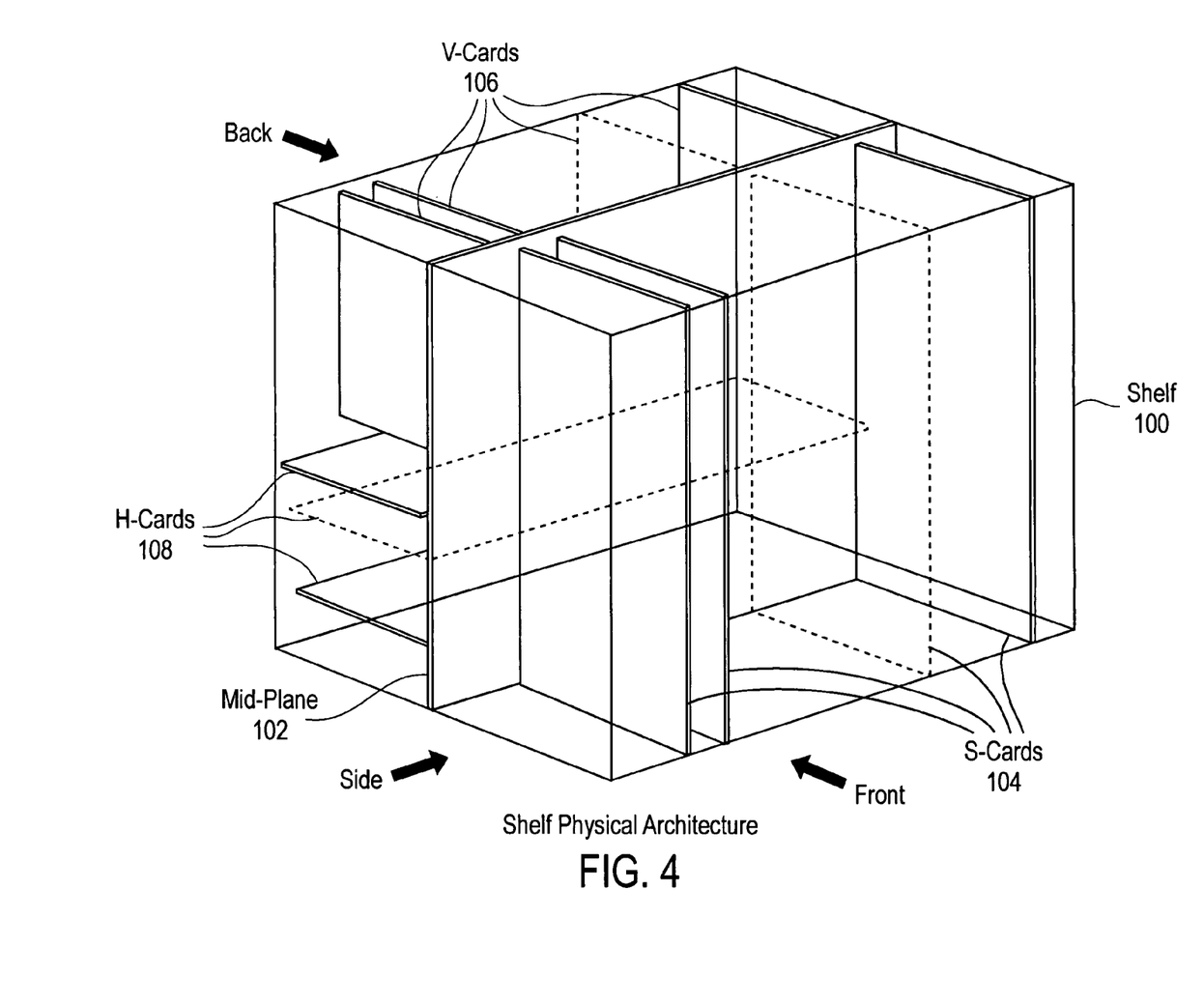
FIG. 4 illustrates a perspective front view of a physical shelf architecture for a cross connect switching system in accordance with the present invention.
Figure 5:
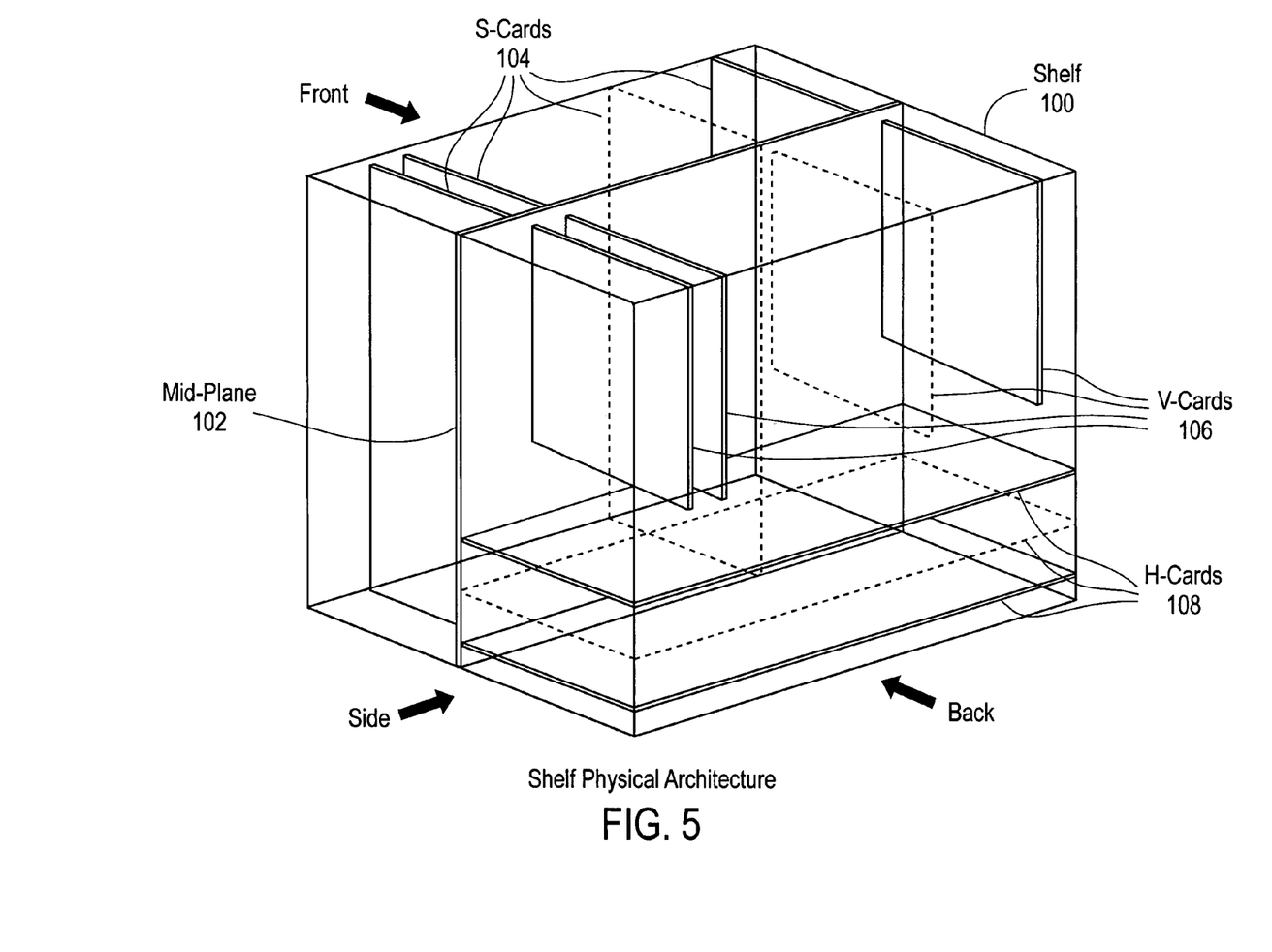
FIG. 5 illustrates a perspective back view of a physical shelf architecture for a cross connect switching system in accordance with the present invention.
Figure 6:
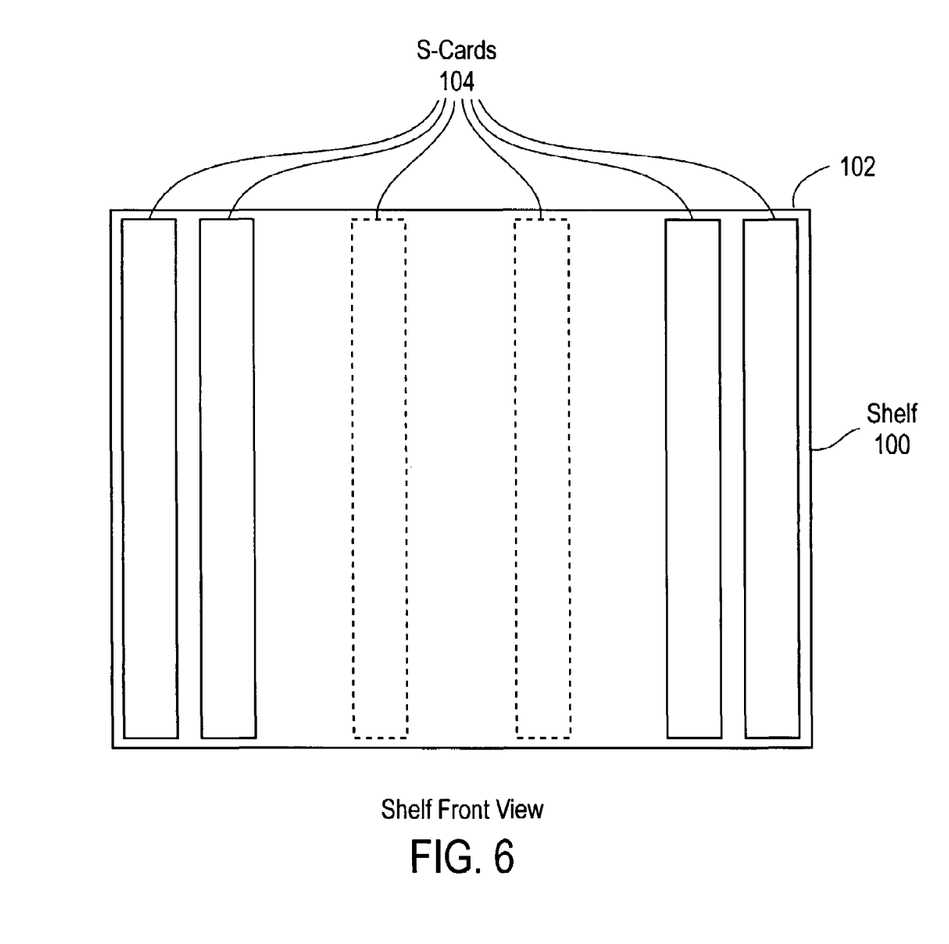
FIG. 6 illustrates a front view of a physical shelf architecture for a cross connect switching system in accordance with the present invention.
Figure 7:
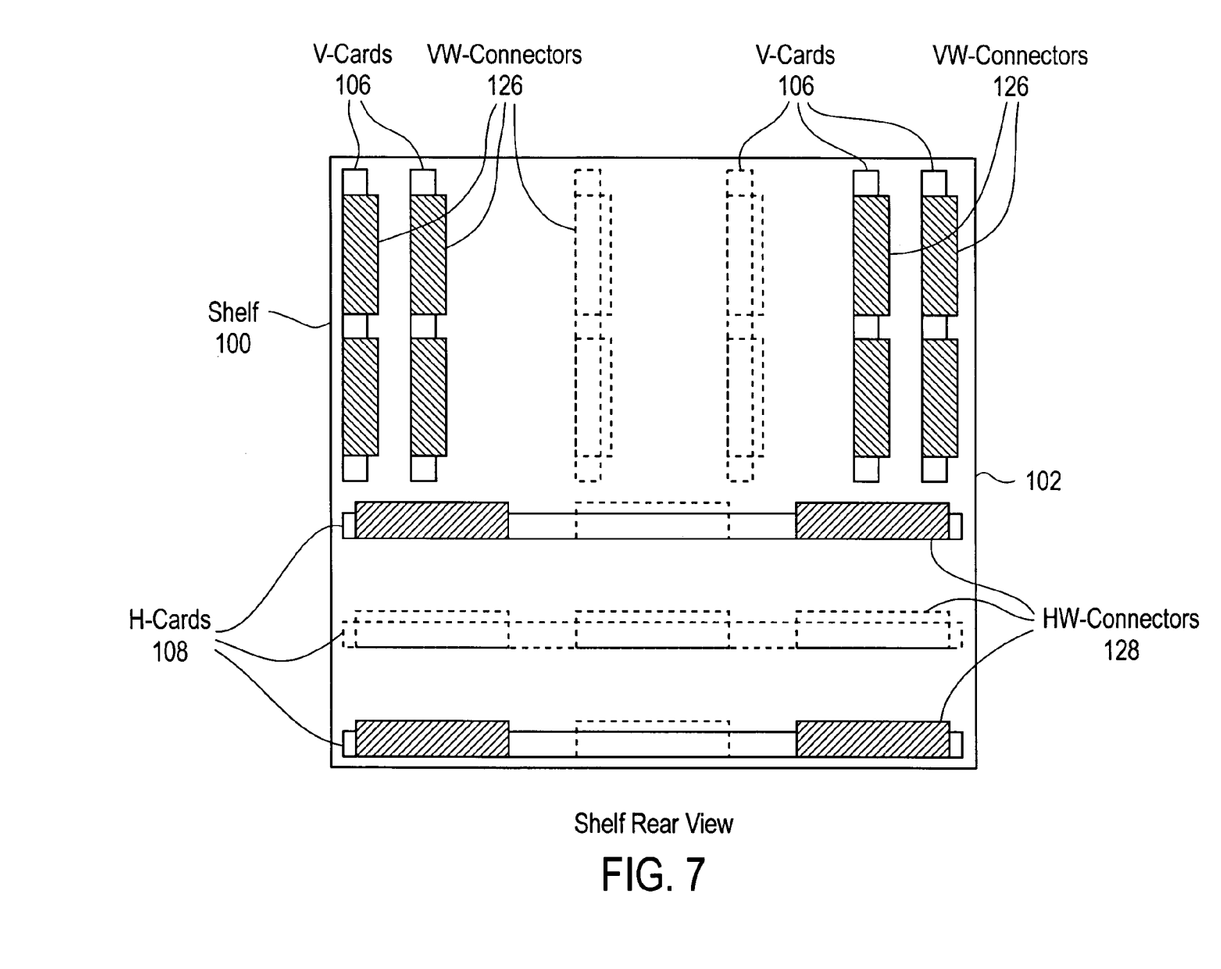
FIG. 7 illustrates a back view of a physical shelf architecture for a cross connect switching system in accordance with the present invention.
Figure 8:
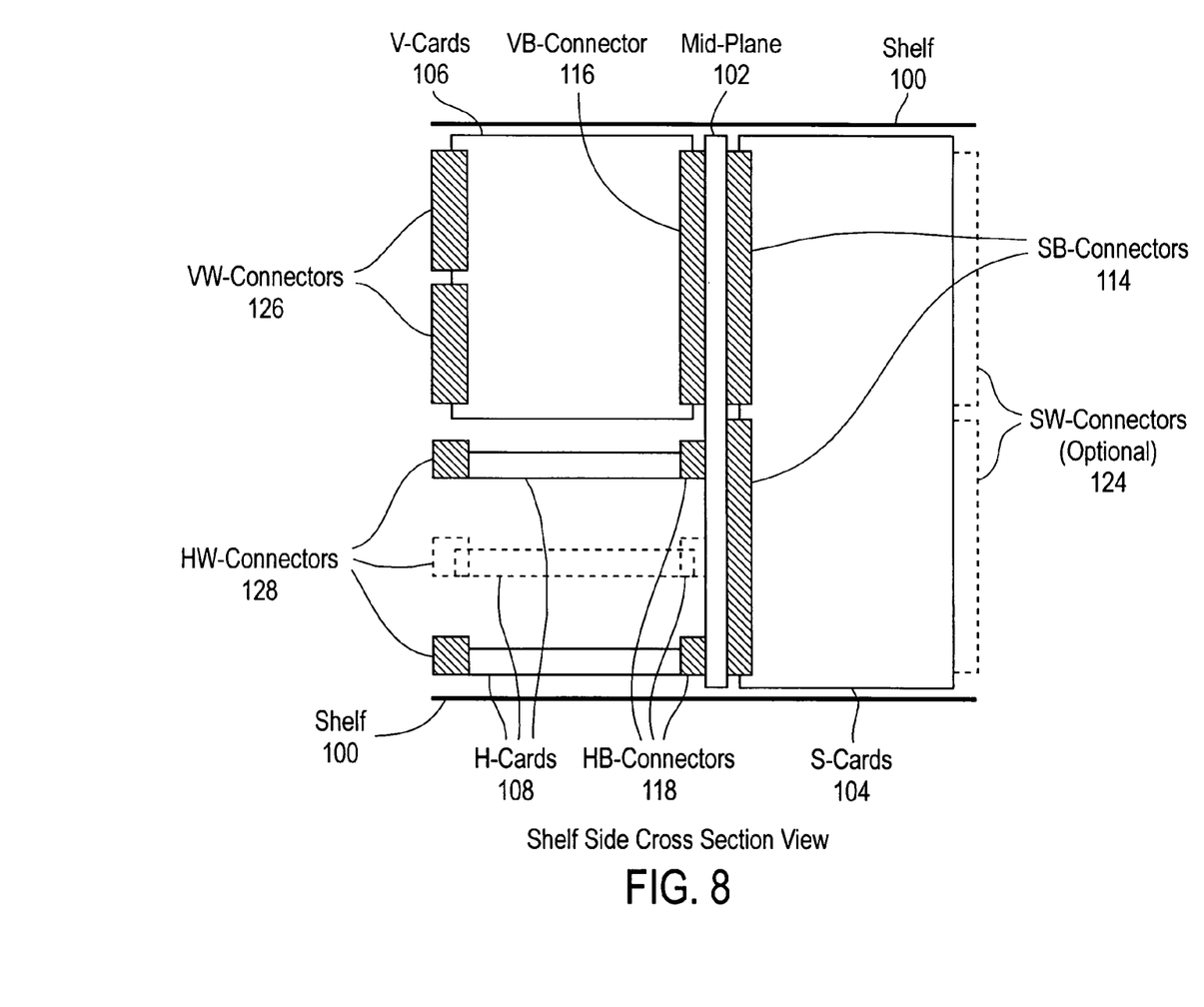
FIG. 8 illustrates a cross sectional side view of a physical shelf architecture for a cross connect switching system in accordance with the present invention.

FIGS. 4 and 5 illustrate perspective front and back views, respectively, of a physical shelf architecture for a cross connect switching system in accordance with the present invention. FIGS. 6 and 7 illustrate front and back views, respectively, of a physical shelf architecture for a cross connect switching system of FIGS. 4 and 5. Further, FIG. 6 illustrates a view directly from the front of the shelf with S-cards inserted. FIG. 7 illustrates a view directly from the rear of the shelf with V-cards and H-cards inserted with connectors. Moreover, FIG. 8 illustrates a cross sectional side view of a physical shelf architecture for a cross connect switching system of FIGS. 4–7.

Reference will now be made concurrently to FIGS. 4–8 for a more detailed description of the present invention. A shelf 100 houses the various components that make up the novel architecture of the present invention. The shelf 100 includes a mid-plane 102 for receiving cards from both the front and back sides. The shelf 100 further includes connectors that are used to insert cards from both sides. The shelf 100 allows for board-to-board level interconnections.

In greater detail, the shelf 100 includes Switch cards ("S-cards") 104 connected to the mid-plane 102 on the front side of the shelf 100. The S-cards 104 are designed so that it can be inserted from the front of the shelf 100 via the SB-connectors 114. The S-cards 104 can be switching stage and/or system control cards, and they perform device-to-device interconnections. The S-cards 104 control the operation of the basic cross connect elements as described above and are further controlled via software to enable switching.

The shelf 100 further includes Vertical cards ("V-cards") 106 that can be connected to the MDF or the outside plant. The V-cards 106 can also be used for inter-shelf connections or inter-rack connections. The V-cards 106 are designed such that they can be inserted from the back of the shelf 100 via the VB-connectors 116. Connections to V-cards 106 via VW-connectors 126 could be the signal entry or exit points representing the ingress or egress ports, respectively, as described above with reference to FIG. 1. The V-cards 106 are also used for inter-shelf or inter-rack connections to construct large capacity system.

The shelf 100 includes Horizontal cards ("H-cards") 108 used for inter-shelf or inter-rack connections. The H-cards 108 generally are not used to connect to the outside plant, but are necessary for constructing large capacity system in which multiple shelves and/or multiple racks are required. The various cards described above are electronic board assemblies.

FIG. 8 illustrates a cross sectional side view of the shelf 100 having cards inserted into the mid-plane 102. As shown, the mid-plane 102 includes the SB-connectors 114 on its front face, whereas the back face of the mid-plane 102 includes the VB-connectors 116 and HB-connectors 118. These connectors are used to make connections between different cards, the mid-plane, inter-shelves, and inter-racks, and to construct systems of varying capacities.

Figure 9:
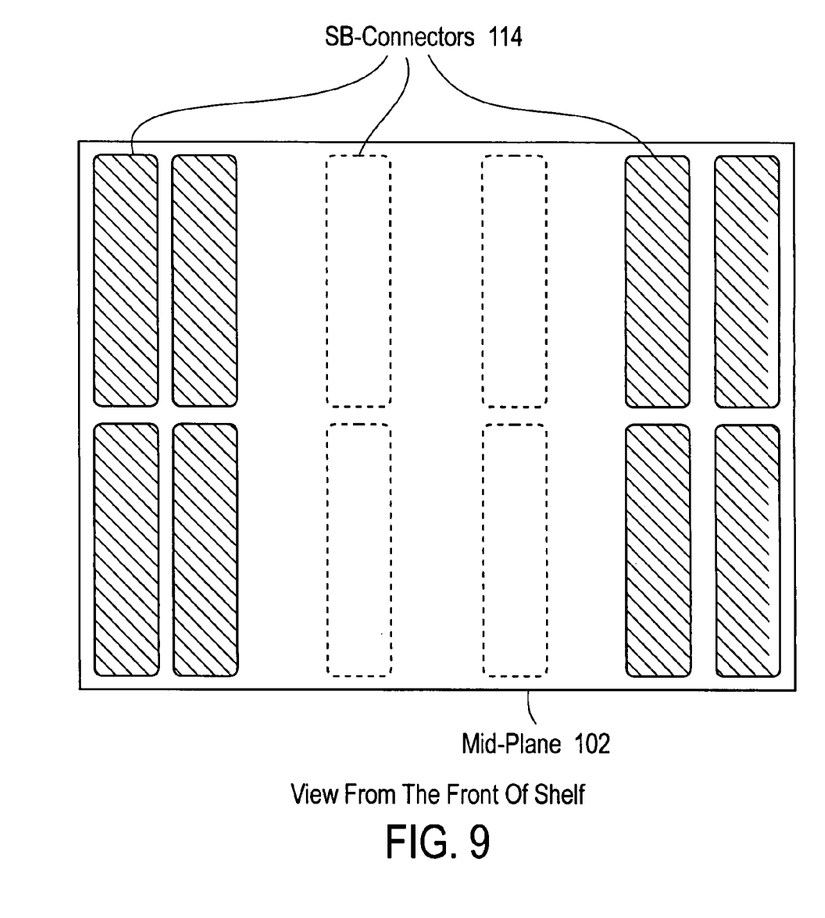
FIG. 9 illustrates a front view of a physical shelf architecture for a cross connect switching system without S-cards in accordance with the present invention.
Figure 10:
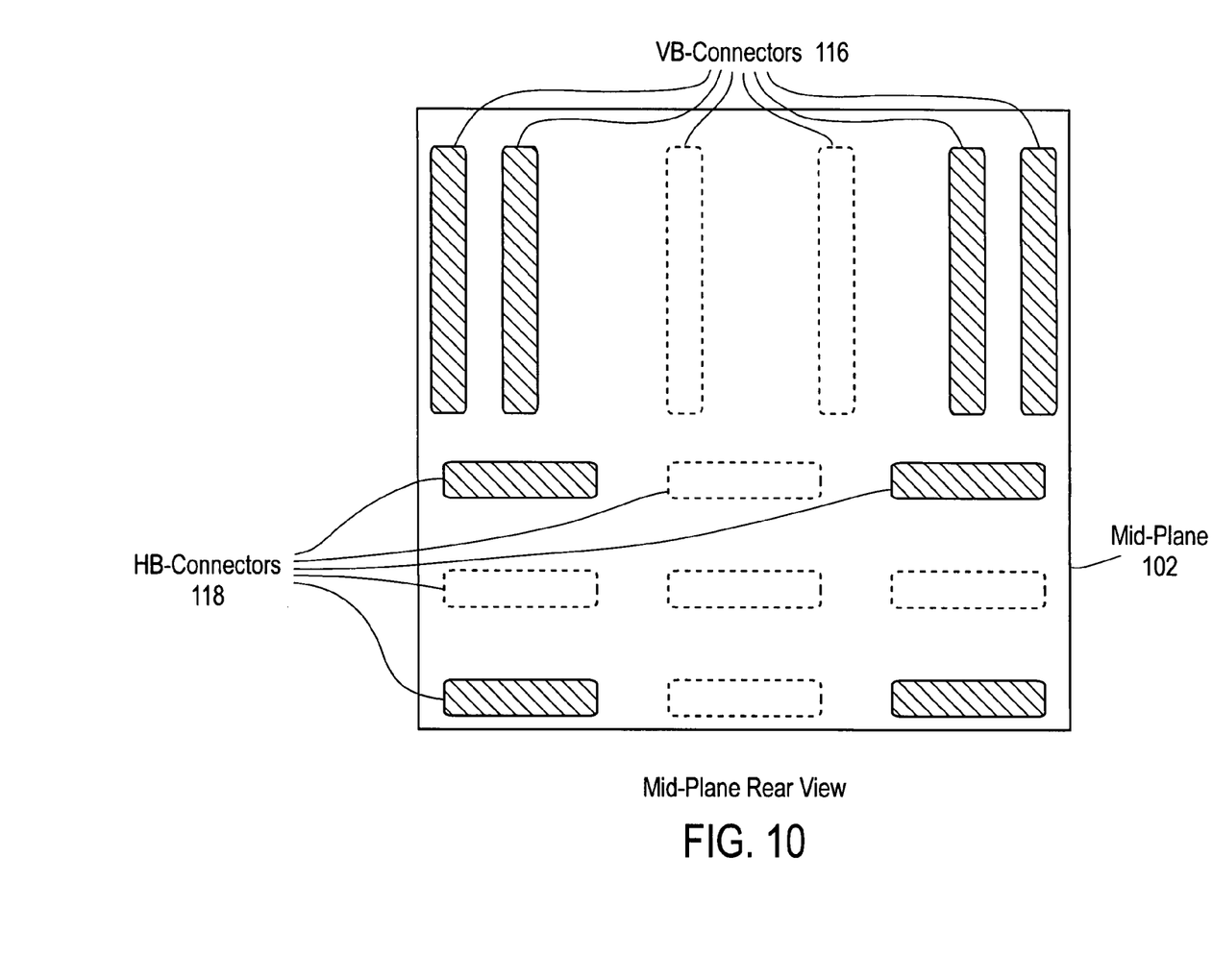
FIG. 10 illustrates a back view of a physical shelf architecture for a cross connect switching system without V-cards and H-cards in accordance with the present invention.

FIG. 9 illustrates a front view of a physical shelf architecture for a cross connect switching system without S-cards 104 connected to the mid-plane 102. The connectors for the S-cards 104 are shown as the SB-connectors 114. FIG. 10 illustrates a physical shelf architecture for a back view of a cross connect switching system without V-cards 106 and H-cards 108 connected to the mid-plane 102. The VB-connectors 116 are used for connection with the V-cards 106, while the HB-connectors 118 are used for connection with the H-cards 108.

Figure 11A:
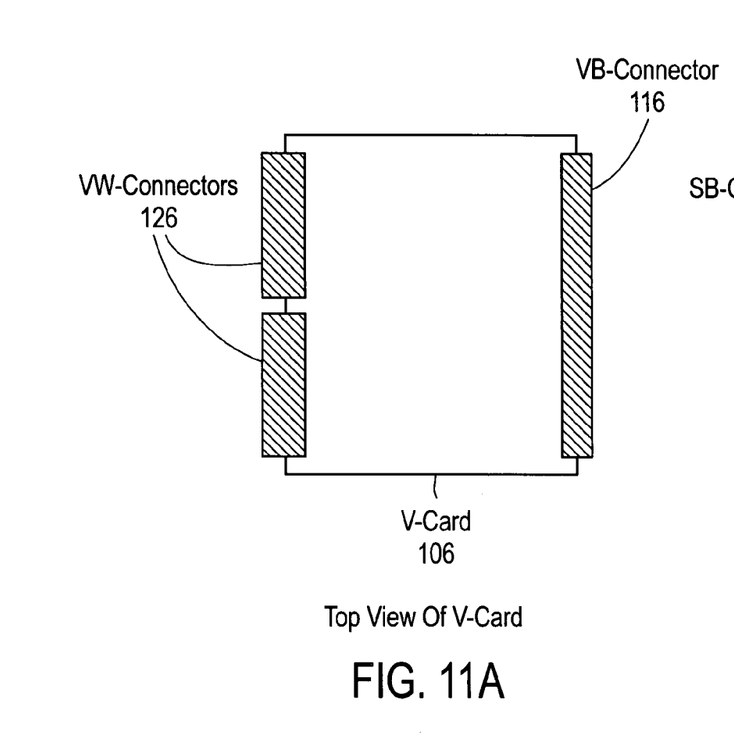
FIG. 11A illustrates a top view of a V-card with connectors in accordance with the present invention.
Figure 11B:
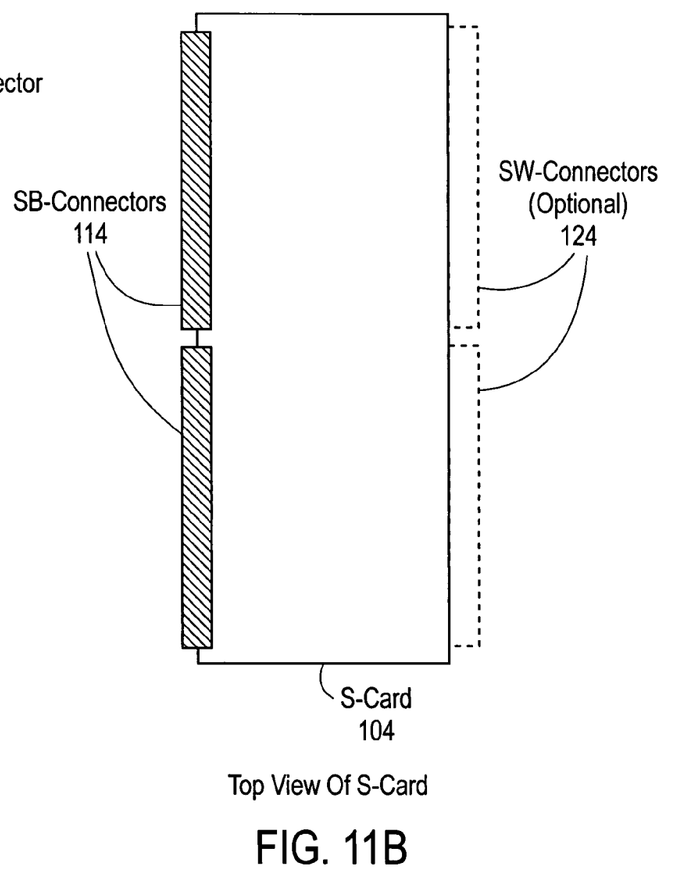
FIG. 11B illustrates a top view of a S-card with connectors in accordance with the present invention.
Figure 12:
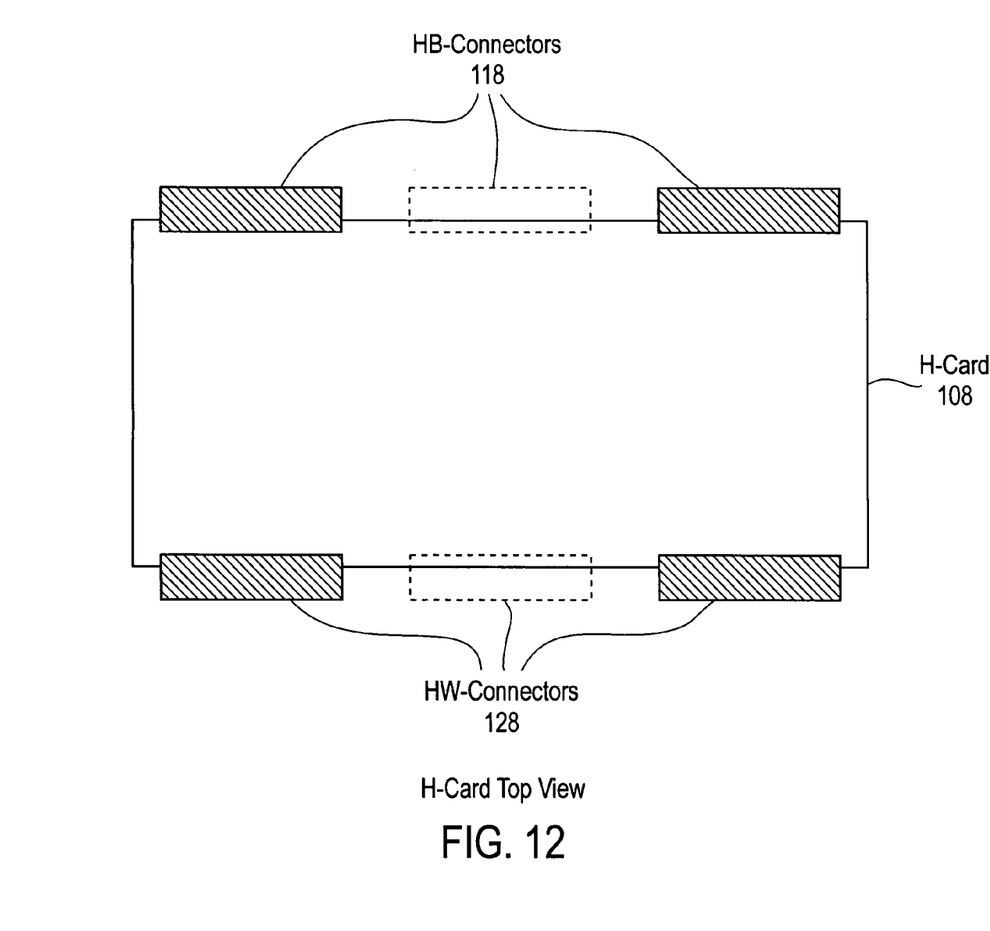
FIG. 12 illustrates a top view of a H-card with connectors in accordance with the present invention.

FIG. 11A illustrates a top view of a V-card with connectors in accordance with the present invention; FIG. 11B illustrates a top view of a S-card with connectors in accordance with the present invention; and FIG. 12 illustrates a top view of a H-card with connectors in accordance with the present invention.

The SB-connectors 114 are used for connection to the mid-plane 102, while the SW-connectors 124 are optional for external, or inter-shelves or inter-racks connections. The VB-connectors 116 are used for connections to the mid-plane 102, while the VW-connectors 126 are used for connection to the MDF, or inter-shelves, or inter-racks connections. Likewise, the HB-connectors 118 are used for connections to the mid-plane 102, while the HW-connectors 128 are used for inter-shelves or inter-racks connections.

A description of a typical metallic path flow in accordance with the present invention with now be described with reference to FIGS. 4–12, in particular FIG. 8. The signal entry point or ingress port for the path is first through the VW-connector 126. The path then flows through the VB-connector 116 via the V-card 106, across the mid-plane 102, through the SB-connector 114 to the S-card 104. Depending on the final destination of the path, the signal metallic path is switched using the S-card 104 by the appropriate basic cross connect elements (as depicted in FIG. 2) under system software control to the SB connector 114. The signal path traverses through the mid-plane 102 and appears at the proper HB-connector 118, and then flows through the H-card 108 to the HW-connector 128. A cable connected to the HW-connector 128 carries the signal either to another V-card 106 or another H-card 108 in a different shelf having the same architecture. Depending on the particular capacity of the system, this signal metallic path will eventually appear on another VW-connector 126 of yet another V-card 106. The final destination is the signal exit point or egress port of the system.

In the previous descriptions, numerous specific details are set forth such as system architecture, electronic components, cards, connectors, paths, etc. to provide a thorough understanding of the present invention. However, as one having ordinary skill in the art would recognize, the present invention can be practiced without resorting to the details specifically set forth.

Although only the above embodiments have been described in detail above, those skilled in the art will readily appreciate that many modifications of the exemplary embodiments are possible without materially departing from the novel teachings and advantages of this invention.

We claim:

1. An apparatus for interconnecting a signal from an ingress port to an egress port in a metallic cross connect system, the apparatus comprising:
   a mid-plane have a front face and a back face;
   a switch card connector attached to the font face of the mid-plane;
   a first vertical card connector attached to the back face of the mid-plane;
   a switch card connected to the mid-plane using the switch card connector;
   a vertical card connected to the mid-plane using the first vertical card connector;
   a second vertical card connector connected to the vertical card for connecting the vertical card to an outside equipment;
   a first horizontal card connector attached to the back face of the mid-plane;
   a horizontal card connected to the mid-plane using the first horizontal card connector, and
   a second horizontal card connector for connecting the horizontal card to another vertical or horizontal card from another apparatus.

2. An apparatus according to claim 1 further comprising another switch card connector connected to the switch card for connecting the switch card to another switch card from another apparatus.

3. An apparatus according to claim 1, wherein the outside equipment comprises a main distribution frame.

4. An apparatus for interconnecting a signal from an ingress port to an egress port in a metallic cross connect system, the apparatus comprising:
   a mid-plane have a front face and a back face;
   a plurality of switch card connectors attached to the front face of the mid-plane;
   a plurality of first vertical card connectors attached to the back face of the mid-plane;
   a plurality of switch cards connected to the aid-plane using the plurality of switch card connectors;
   a plurality of vertical cards connected to the mid-plane using the plurality of first vertical card connectors;
   a plurality of second vertical card connectors connected to the plurality of vertical cards for connecting the plurality of vertical cards to an outside equipment;
   a plurality of first horizontal card connectors attached to the back face of the mid-plane;
   a plurality of horizontal cards connected to the mid-plane using the plurality of first horizontal card connectors; and
   a plurality second horizontal card connectors for connecting the plurality of horizontal cards to another vertical or horizontal card from another apparatus.

5. An apparatus according to claim 4 further comprising another plurality of switch card connectors connected to the plurality of switch cards for connecting the plurality of switch cards to another plurality of switch cards from another apparatus.

6. An apparatus according to claim 4, wherein the outside equipment comprises a main distribution frame.

7. A mid-plane apparatus in a metallic cross connect system, comprising:
   a front face and a back face;
   a plurality of switch card connectors attached to the front face;
   a plurality of vertical card connectors attached to the back face; and
   a plurality of horizontal card connectors attached to the back face of the mid-plane.

* * * * *